United States Patent [19]

Okano

[11] Patent Number: 4,827,160
[45] Date of Patent: May 2, 1989

[54] DYNAMIC DECODER CIRCUIT WITH CHARGE-SHARING PREVENTION MEANS

[75] Inventor: Yoshiaki Okano, Tokyo, Japan
[73] Assignee: Fujitsu Limited, Kawasaki, Japan
[21] Appl. No.: 166,271
[22] Filed: Mar. 10, 1988
[30] Foreign Application Priority Data Mar. 18, 1987 [JP] Japan .................................. 62-061123

[51] Int. Cl.[4] .......................................... H03K 19/003
[52] U.S. Cl. .................................... 307/443; 307/449; 307/452; 307/481; 307/579
[58] Field of Search ............... 307/443, 448, 449, 451, 307/452, 453, 463, 481, 577, 579, 584–585, 582, 246

[56] References Cited

U.S. PATENT DOCUMENTS

| | | | |
|---|---|---|---|
| 3,982,138 | 9/1976 | Luisi et al. | 307/452 X |
| 4,415,819 | 11/1983 | Mathes | 307/481 |
| 4,569,032 | 2/1986 | Lee | 307/481 X |
| 4,570,084 | 2/1986 | Griffin et al. | 307/453 X |
| 4,649,296 | 3/1987 | Shoji | 307/443 X |
| 4,659,948 | 4/1987 | Sunter et al. | 307/452 X |
| 4,700,086 | 10/1987 | Ling et al. | 307/443 |
| 4,710,650 | 12/1987 | Shoji | 307/443 X |
| 4,780,626 | 10/1988 | Guerin et al. | 307/452 X |

Primary Examiner—David Hudspeth
Attorney, Agent, or Firm—Armstrong, Nikaido Marmelstein & Kubovcik

[57] ABSTRACT

A dynamic type decoder circuit including a first power source line; a second power source line; and output node; a first transistor connected between the first power source line and the output node, the first transistor being turned on during a reset period to reset the output potential of the output node to a predetermined potential level; a second transistor connected to a second power source line, the second transistor being turned on during a decoding period; a plurality of decoding transistors connected in series between the output node and the second transistor, the decoding transistors being controlled in accordance with address signals; and means for forcibly turning on one or more decoding transistors connected between the output node and the decoding transistor directly connected to the second transistor during the reset period regardless of the potential levels of the address signals.

12 Claims, 6 Drawing Sheets

DYNAMIC DECODER CIRCUIT WITH CHARGE-SHARING PREVENTION MEANS

BACKGROUND OF THE INVENTION

1. Field of the Invention

The present invention relates to a dynamic type decoder circuit used for memory or register circuits, more particularly, to a decoder circuit which stabilizes the output level during the decoding period to a predetermined level (selected level or nonselected level) in accordance with address information.

2. Description of the Related Art

In general, usual dynamic type decoder circuits are provided with a plurality of decoding transistors to whose gates address signals are input, a first transistor to whose gate a clock signal is input and which is conductive at a reset period (for example, a precharging transistor), and a second transistor to whose gate another clock signal is input and which is conductive at a decoding period (active period) (for example, a discharge transistor). By this, each time the first transistor turns on during the reset period (at which time the second transistor turns off), the stray capacity at the node of the output side of the decoder circuit is precharged and the potential of the output side becomes high level.

Next, when a certain cycle period (1) is entered, in the decoding period of the first half of the cycle period (1), the decoding transistors directly connected to the output side node are turned off and the rest of the decoding transistors are turned on, in accordance with the address signals input to the decoding transistors. At this time, the potential of the output side node remains the above-mentioned high level (precharged level) and the decoder circuit is in the nonselected state, but the potentials of the connection nodes of the above-mentioned decoding transistors are made low level since all of the charges precharged to the stray capacities existing at the connection nodes are discharged through the above-mentioned second transistor, which is in the on state at that time. Note that the latter half of the cycle period (1) is the reset period (where the output side node is again precharged), but the potentials of the connection nodes remain at the above-mentioned low level.

Next, at the decoding period of the first half of the cycle period (2), the decoding transistors directly connected to the second transistor are turned off and the remaining decoding transistors are turned on, in accordance with the address signals input to the decoding transistors. At this time too, the potential of the output side node must be the above-mentioned high level (that is, the decoder circuit is in the nonselected state). However, at the prior cycle period (1), the potentials of the above-mentioned connection nodes all became low level and the stray capacities in the discharged state existing at the connection nodes become connected in parallel through the on state decoding transistors with the stray capacity of the precharged state existing at the output side node. In particular, when the ratio of the stray capacities existing at the connection nodes to the stray capacity existing at the output side node is high, a so-called capacitive division of voltage occurs during the decoding period and the potential of the output side node drops. Therefore, in the above-mentioned decoding period, despite the decoder circuit being in the nonselected state, there is a danger of erroneous recognition of the selected state where the potential of the output side node is the low level (the selected state occurs when all the decoding transistors turn on in accordance with the address signals input to the decoding transistors during the decoding period).

As mentioned above, in the above-mentioned usual dynamic type decoder circuit, the stray capacities existing at the connection nodes of the decoding transistors are connected through the on state decoding transistors with the stray capacity existing at the output side node during the decoding period (active period), whereby the above-mentioned capacitive division of voltage occurs and the potential of the output side node fluctuates. In particular, when the value of the stray capacities existing at the connection nodes is great, as mentioned above, the output side potential fluctuates strongly and may become a cause of misoperation (with the nonselected state being erroneously recognized as the selected state).

SUMMARY OF THE INVENTION

The present invention was made so as to solve the above-mentioned problems and has as its object the elimination of fluctuations in the output side potential due to the above-mentioned capacitive division of voltage and thus the prevention of fluctuations in the output side potential which could lead to erroneous recognition of the nonselected state as the selected state.

To achieve the above-mentioned object, the present invention provides a dynamic type decoder circuit comprising a first power source line; a second power source line; an output node; a first transistor connected between the first power source line and the output node, the first transistor being turned on during a reset period to reset the output potential of the output node to a predetermined potential level; a second transistor connected to the second power source line, the second transistor being turned on during a decoding period; a plurality of decoding transistors connected in series between the output node and the second transistor, the decoding transistors being controlled in accordance with address signals; and means for forcibly turning on one or more decoding transistors connected between the output node and the decoding transistor directly connected to the second transistor during the reset period regardless of the potential levels of the address signals.

According to the above constitution, regardless of the levels of the input address signals, by placing the decoding transistors connected between the output node and the decoding transistors directly connected to the second transistor in the on state with each reset period, the stray capacities existing at the connection nodes of the plurality of decoding transistors are precharged (in the case where the precharging period is the reset period) or discharged (in the case where the discharging period is the reset period) with each reset period, so no fluctuations of the output potential due to capacitive division of voltage such as mentioned above occur during the decoding (active) period after the reset period.

DESCRIPTION OF THE PREFERRED EMBODIMENTS

Figure 1:
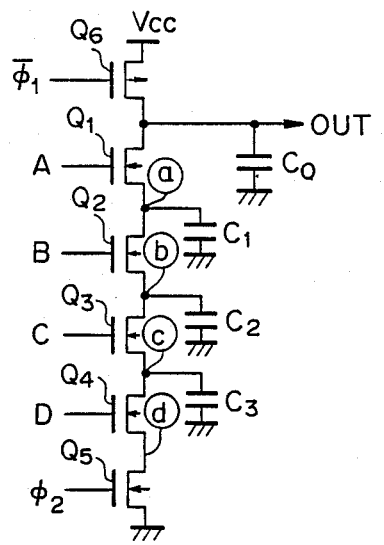
FIG. 1 is a circuit diagram illustrating a dynamic decoder circuit of the prior art.

To further clarify the technical background of the present invention, an example of the constitution of a dynamic type decoder circuit of the prior art is given in FIG. 1. In FIG. 1, $Q_1$ to $Q_4$ are decoding N-channel type transistors to whose gates address signals A to D are input, $Q_5$ is a discharging N-channel type transistor to whose gate a clock signal $\phi_2$ is input, $Q_6$ is a precharging P-channel type transistor to whose gate a clock signal $\phi_1$ is input, each time the clock signal $\phi_1$ becoming low level and the transistor $Q_6$ turning on (at which time the discharging transistor $Q_5$ turning off), the stray capacity $C_0$ existing at the connection node of the transistors $Q_6$ and $Q_1$ (output side node) being precharged and the output signal OUT taken out from the output side node becoming high level.

Figure 2:
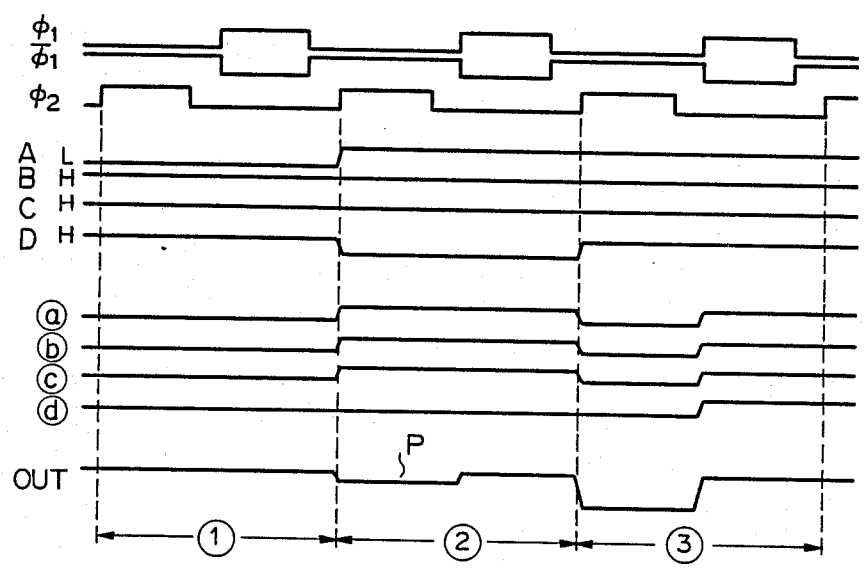
FIG. 2 is a timing chart showing the operation of the circuit of FIG. 1.

FIG. 2 is a timing chart explaining the operation of the dynamic type decoder circuit shown in FIG. 1. First, in one cycle period (1), each of the address signals B, C, and D input to the decoding transistors $Q_2$ to $Q_4$ is high level, but the address signal A input to the decoding transistor $Q_1$ is made low level and the transistor $Q_1$ is turned off. Therefore, even if the clock signal $\phi_2$ becomes high level and the discharging transistor $Q_5$ turns on (even during the active period), the output potential OUT remains high level (precharged level) and the decoder circuit is in the nonselected state. The potentials of the nodes (a) to (d) corresponding to the connection points of the decoding transistors $Q_1$ to $Q_4$ and the discharging transistor $Q_5$ in the cycle period (1) are made low level as the transistor $Q_1$ is off and, thereby, all the charges of the stray capacities $C_1$ to $C_3$ existing at the nodes (a) to (c) are discharged to the ground side through the transistor $Q_5$. Note that the latter half of the cycle period (1) is the precharging period (reset period), but the transistor $Q_1$ turns off and the potentials of the nodes (a) to (d) remain low level. (See FIG. 2.)

In the next cycle period (2), the address signals A, B, and C are high level (therefore, the transistors $Q_1$ to $Q_3$ are in the on state), but the address signal D is made the low level and the transistor $Q_4$ turns off. Therefore, even if the clock signal $\phi_2$ becomes high level and the discharging transistor $Q_5$ turns on (even in the active period), the output potential OUT is high level (nonselected state), but in the prior cycle period (1), all the potentials of the nodes (a) to (c) become low level, so the stray capacities $C_1$ to $C_3$ of the discharged state existing at the nodes (a) to (c) become connected in parallel with the stray capacity C of the precharged state existing at the output side through the on state transistors $Q_1$ to $Q_3$. When the ratio of the stray capacities $(C_1+C_2+C_3)$ to the stray capacity $C_0$ is high, the so-called capacitive division of voltage shown by reference symbol P in FIG. 2 occurs, level changes (level reductions) occur in the high level potential OUT of the output side, and, despite the decoder circuit being in the nonselected state, there is a danger of erroneous recognition that the output potential is the low level, i.e., the selected state. These fluctuations in output due to the capacitive division of voltage may always occur in the case where the stray capacities $C_1$ to $C_3$ in the discharged state are connected to the stray capacity $C_0$ of the precharged state existing at the output side node through on state decoding transistors during the active period. As mentioned above, when all of the stray capacities $C_1$ to $C_3$ are connected in parallel to the stray capacity $C_0$ through on state decoding transistors, the effects of the capacitive division of voltage appear most strongly.

Next, as shown in the timing chart of FIG. 2, in the latter half of the cycle period (2), the precharging period is again entered and the potential of the output side OUT is reset to the usual precharged level (high level).

Further, in the next cycle period (3), all the address signals A to D become high level and all the decoding transistors $Q_1$ to $Q_4$ are turned on, so in the active period when the clock signal $\phi_2$ becomes high level and the discharging transistor $Q_5$ turns on, the potential of the output side OUT becomes low level and the decoder circuit is placed in the selected state. Note that even in the cycle period (3), the precharging period is entered in the latter half and the potential of the output side OUT is reset to the usual precharged level (high level).

As mentioned above, in the above-mentioned prior art type dynamic type decoder circuit, the stray capacities existing at the connection points of the decoding transistors are connected to the stray capacity existing at the output side through the on state decoding transistors during the active period, whereby fluctuations occur in the output level due to so-called capacitive division of voltage. In such cases, particularly when the values of the stray capacities existing at the connection points are large, there are strong fluctuations in the output level, which can become causes of misoperation.

Figure 3:
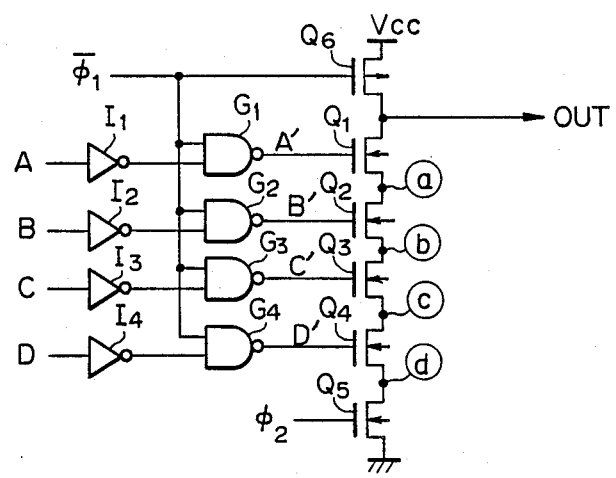
FIG. 3 is a circuit diagram showing the basic construction of a dynamic decoder circuit according to an embodiment of the present invention.
Figure 4:
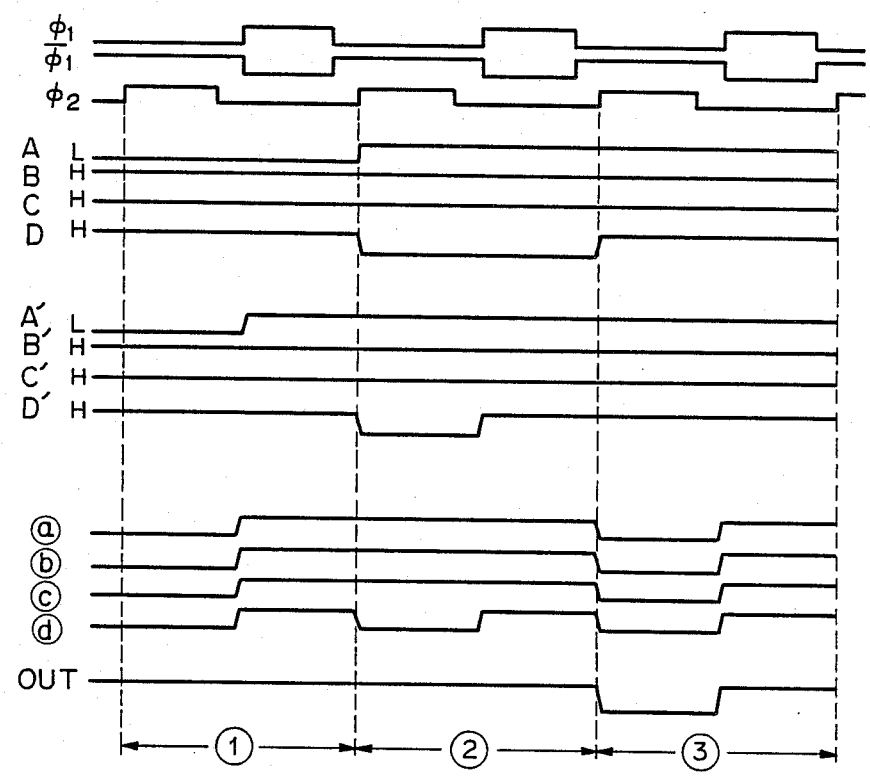
FIG. 4 is a timing chart showing the operation of the circuit of FIG. 3.

The present invention was made to resolve the above problem. FIG. 3 shows a dynamic decoder circuit according to an embodiment of the present invention. In FIG. 3, the portions corresponding to the prior art of FIG. 1 are given the same reference symbols. That is, $Q_1$ to $Q_4$ are N-channel type decoding transistors, $Q_5$ an N-channel type discharging transistor, and $Q_6$ a P-channel type precharging transistor. FIG. 4 is a timing chart showing the operation of the circuit of FIG. 3, wherein the period when a clock signal $\phi_1$ input to the transistor $Q_6$ is low level (that is, the period when the transistor $Q_6$ is on) is the precharging period (reset period), and the period when the clock signal $\phi_1$ is high level is the active period, during which active period, the clock signal $\phi_2$ becomes high level and the discharging transistor $Q_5$ becomes on.

A to D are address signals input to the gates of the decoding transistors $Q_1$ to $Q_4$. Instead of the address signals A to D being directly input to the transistors $Q_1$ to $Q_4$, as in the above-mentioned prior art, the address signals A to D, as shown in FIG. 3, are first inverted by the inverters $I_1$ to $I_4$, then input to one of the input sides of the NAND gates $G_1$ to $G_4$, to whose other input sides are input the clock signal $\phi_1$. The output signals A' to D' of the NAND gates $G_1$ to $G_4$ are input to the gates of the decoding transistors $Q_1$ to $Q_4$. Here, during the precharging period (reset period), the clock signal $\phi_1$ is low level, so the output signals A' to D' of the NAND gates $G_1$ to $G_4$ (that is, the input signals of the decoding transistors $Q_1$ to $Q_4$) become high level, regardless of the levels of the input address signals A to D.

That is, for example, in one cycle period (1), the address signal A becomes low level and the address signals B, C, and D become high level (nonselected state), but in the latter half precharging period, the output signal A' of the NAND gate $G_1$ becomes high level and, further, the output signals B' to D' of the NAND gates $G_2$ to $G_4$ become high level like the high level address signals B to D. Therefore, during the precharging period (reset period), the stray capacities existing at the nodes (a) to (d) all are precharged and the potentials of the nodes (a) to (d) all become high level.

Therefore, in the first half (active period) of the next cycle period (2) (nonselected period), even if the high level address signals A to C and the low level address signal D are input to the decoding transistors as they are as the above-mentioned signals A' to D' (that is, the transistors $Q_1$ to $Q_3$ turn on and the transistor $Q_4$ turns off) and the stray capacities existing at the nodes (a) to (c) are connected in parallel to the stray capacity of the output side (connection point of transistors $Q_6$ and $Q_1$), since the stray capacities existing at the nodes (a) to (c) are already precharged, there is no fluctuation (decline) in the output level due to capacitive division of voltage and the potential of the output side becomes completely the high level (nonselected state). Note that in the precharging period of the latter half of the cycle period (2), the signals A' to D' again become high level and the stray capacities existing at the above-mentioned nodes (a) to (d) are all precharged.

At the next cycle period (3) (selected period), all the address signals A to D become high level. At the first half active period, the high level address signals A to D are input to the decoding transistors $Q_1$ to $Q_4$ as they are as the signals A' to D' from the output sides of the NAND gates $G_1$ to $G_4$, whereby the decoding transistors $Q_1$ to $Q_4$ turn on. Further, the high level clock signal $\phi_2$ results in the decoding transistor $Q_5$ turning on, the potential of the output side OUT becoming low level, and the decoder circuit entering the selected state. Note that in the precharging period of the latter half of the period (3), the high level address signals A to D are input to the decoding transistors $Q_1$ to $Q_4$ as they are as the signals A' to D', the transistors $Q_1$ to $Q_4$ turn on, and the stray capacities of the nodes (a) to (d) are precharged.

In this way, with each reset period (in this embodiment, precharging period), the stray capacities of the nodes (a) to (d) are precharged, whereby even if the stray capacities existing at the nodes (a) to (c) are connected to the stray capacity of the output side during the active period, as in the above-mentioned cycle period (2), there is no fluctuation of the output level due to capacitive division of voltage.

Figure 5:
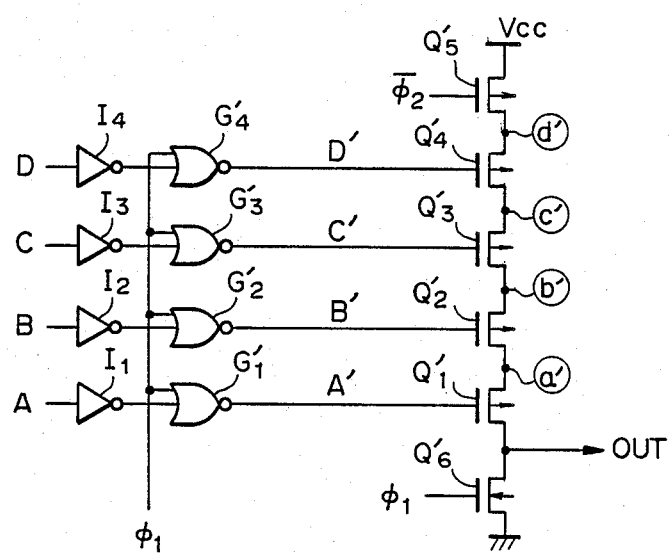
FIG. 5 is a circuit diagram showing the basic construction of a dynamic type decoder circuit according to another embodiment of the present invention.

FIG. 5 shows a dynamic type decoder circuit of another embodiment of the present invention, wherein $Q_5$, is a precharging P-channel type transistor to whose gate a clock signal $\phi_2$ is input, $Q_1'$ to $Q_4'$ are decoding P-channel type transistors, and $Q_6'$ is a discharging N-channel type transistor to whose gate a clock signal $\phi_1$ is input. A to D are address signals which are first inverted in level by the inverters $I_1$ to $I_4$, then input to one of the input sides of the NOR gates $G_1'$ to $G_4'$ to whose other input sides the clock signal $\phi_1$ is input. The output signals A' to D' of the NOR gates $G_1'$ to $G_4'$ are input to the gates of the decoding transistors $Q_1'$ to $Q_4'$.

In this embodiment, the discharging period, when the clock signal $\phi_1$ is high level and the transistor $Q_6'$ turns on, is the rest period. During the discharging period, since the clock signal $\phi_1$ is the high level, the output signals A' to D' of the NOR gates $G_1'$ to $G_4'$ (that is, the input signals of the decoding transistors $Q_1'$ to $Q_4'$) become low level regardless of the levels of the input address signals A to D.

Therefore, during the discharging period, the decoding P-channel type transistors $Q_1'$ to $Q_4'$ all become on, the charges of the stray capacities existing at the nodes (a') to (d') ar discharged to the ground side through the decoding transistor $Q_6'$, and the potentials of the nodes (a') to (d') become low level.

Therefore, during the next active period (nonselected period), even if the address signals A, B, and C become low level, the address signals A to D are input as they are from the output sides of the NOR gates $G_1'$ to $G_4'$ as the signals A' to D' to the decoding transistors, and, thereby, the transistors $Q_1'$ to $Q_3'$ turn on and the transistor $Q_4'$ turns off, the potential OUT taken out from the output side (connection point between transistor $Q_1'$ and $Q_6'$) maintains the complete low level and there will be no rise to the high level side (selected side) due to the above-mentioned capacitive division of voltage.

Note that in the embodiment of FIG. 5, the period in which all the address signals A to D become low level is the selected period. In this case, during the active period, the low level address signals A to D are input as they are as the low level signals A' to D' to the decoding transistors $Q_1'$ to $Q_4'$, whereby the decoding transistors $Q_1'$ to $Q_4'$ turn on. Further, the precharging transistor $Q_5'$ to which a low level clock signal $\phi_2$ is input turns on. By this, the output potential OUT becomes high level and the selected state is entered.

Figure 6:
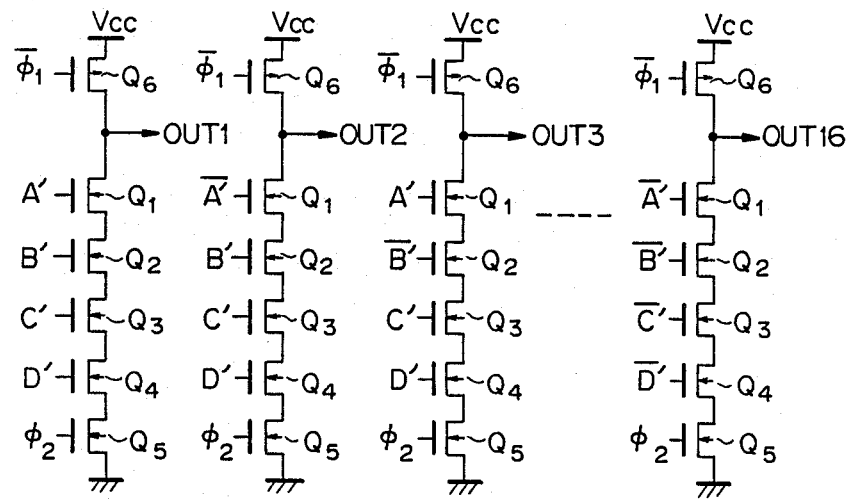
FIG. 6 is a circuit diagram showing the overall constitution in the case of constructing a decoder circuit with four inputs and 16 outputs using the decoder circuit of FIG. 3.
Figure 6:
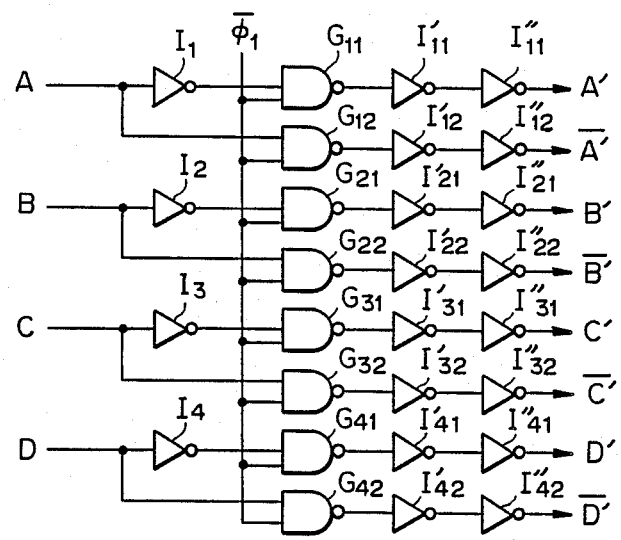

FIG. 6 shows the overall constitution of a decoder circuit in the case where the dynamic type decoder circuit shown in FIG. 3 is used and 16 output signals OUT1 to OUT16 are output by the four address input signals A to D. The signals A', A' to D', D' input to the decoder circuits are formed by a circuit constituted by the inverters $I_1$ to $I_4$, the NAND gates $G_{11}$, $G_{12}$ to $G_{41}$, $G_{42}$, the inverters $I_{11}'$, $I_{12}'$, to $I_{41}'$, $I_{42}'$, and the inverters $I_{11}'$, $I_{12}''$, to $I_{41}''$, $I_{42}''$.

Figure 7:
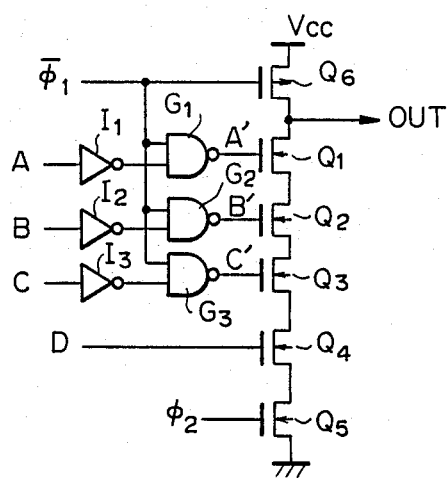
FIG. 7 and FIG. 8 are circuit diagrams showing the basic construction of dynamic type decoder circuits of still other embodiments of the present invention.
Figure 8:
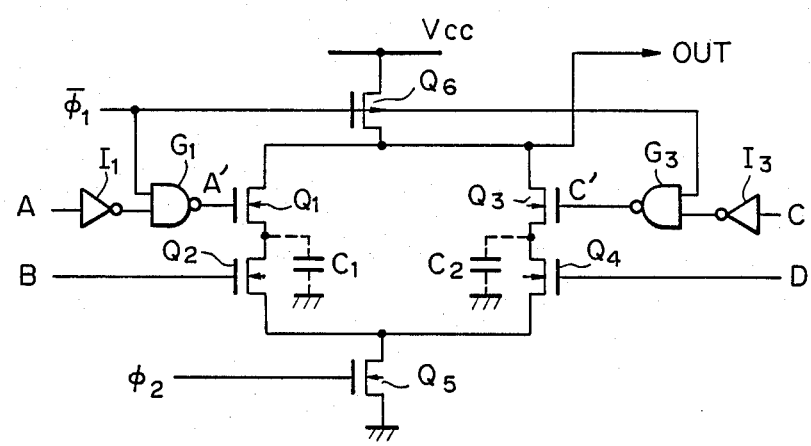

FIG. 7 shows another embodiment of the present invention, in which embodiment the address signal D is directly input to the gate of the transistor $Q_4$ (decoding transistor directly connected to the discharge transistor $Q_5$) shown in the embodiment of FIG. 3. That is, the present invention takes up the problem of capacitive division of voltage between the stray capacities existing at the nodes (a) to (c) and the stray capacity of the output side mentioned above. In principle, the inverter $I_4$ and the NAND gate $G_4$ shown in FIG. 3 are not necessarily required. Note that the inverter $I_4$ and NAND gate $G_4$ may be provided as shown in the above-mentioned FIG. 3 with the aim of adjusting the timing of the address signals A to D. FIG. 8 shows still another embodiment of the present invention, in which embodiment shown in FIG. 8 when the address signals A and B are high level or the address signals C and D are high level, if the discharging transistor $Q_5$ becomes on due to the clock signal $\phi_2$, the potential of the output side OUT becomes low level, i.e., the selected state. In this case too, the stray capacities $C_1$ and $C_2$ existing between the decoding transistors $Q_1$ and $Q_2$, and $Q_3$ and $Q_4$, cause the above-mentioned problem in the same way as the previously mentioned embodiments. Note that the address signals B and D are directly input to the gates of the decoding transistors $Q_2$ and $Q_4$ directly connected to the discharging transistor $Q_5$, but it is also possible to input the address signals B and D through the inverters and NAND gates like with the other decoding transistors $Q_1$ and $Q_3$.

The above-mentioned embodiment of FIG. 8 is a modification of the embodiment of FIG. 3, but it is possible to modify the above-mentioned embodiment of FIG. 5 in the same way and construct a circuit wherein the potential of the output side is made high level and the selected state during the decoding period, for example, when the address signals A and B become low level or the address signals C and D become low level.

According to the present invention, even when the stray capacities existing at the connection points of the decoding transistors are large, there are no fluctuations in the output potential due to capacitive division of voltage between the stray capacities existing at the connection points and the stray capacity existing at the output side during the active period and it is possible reliably prevent erroneous recognition of the output potential level.

I claim:

1. A dynamic type decoder circuit comprising:
   a first power source line;
   a second power source line;
   an output node;
   a first transistor connected between said first power source line and said output node, said first transistor being turned on during a reset period to reset the output potential of said output node to a predetermined potential level;
   a second transistor connected to said second power source line, said second transistor being turned on during a decoding period;
   a plurality of decoding transistors connected in series between said output node and said second transistor, said plurality of decoding transistors being controlled in accordance with address signals; and
   means for forcibly turning on one or more of said plurality of decoding transistors connected between said output node and the decoding transistor directly connected to said second transistor during said reset period regardless of the potential levels of said address signals.

2. A dynamic type decoder circuit according to claim 1, further comprising means for forcibly turning on said decoding transistor directly connected to said second transistor during said reset period regardless of the potential levels of said address signals.

3. A dynamic type decoder circuit according to claim 1, further comprising a plurality of other decoding transistors connected in series between said output node and said second transistor and connected in parallel with said plurality of decoding transistors, said plurality of other decoding transistors being controlled in accordance with address signals; and
   means for forcibly turning on one or more of said plurality of other decoding transistors connected between said output node and the other decoding transistor directly connected to said second transistor during said reset period regardless of the potential levels of said address signals.

4. A dynamic type decoder circuit according to claim 3, further comprising means for forcibly turning on said decoding transistor and said other decoding transistor directly connected to said second transistor during said reset period regardless of the potential levels of said address signals.

5. A dynamic type decoder circuit according to claim 1, wherein said first transistor and said second transistor are a P-channel type transistor and an N-channel type transistor, respectively, and said means for forcibly turning transistors on comprises one or more inverters each receiving one of the address signals and one or more NAND gates each receiving a clock signal supplied to said first transistor and the output signal from one of said inverters, each output signal of said NAND gates being supplied to one of said decoding transistors connected between said output node and said decoding transistor directly connected to said second transistor.

6. A dynamic type decoder circuit according to claim 1, wherein said first transistor and said second transistor are an N-channel type transistor and a P-channel type transistor, respectively, and said means for forcibly turning transistors on comprises one or more inverters each receiving one of the address signals and one or more NOR gates each receiving a clock signal supplied to said first transistor and the output signal from one of said inverters, each output signal of said NOR gates being supplied to one of said decoding transistors connected between said output node and said decoding transistor directly connected to said second transistor.

7. A dynamic type decoder circuit according to claim 2, wherein said first transistor and said second transistor are a P-channel type transistor and an N-channel type transistor, respectively, and said means for forcibly turning transistors on comprises a plurality of inverters each receiving one of the address signals and a plurality of NAND gates each receiving a clock signal supplied to said first transistor and the output signal from one of said inverters, each output signal of said NAND gates being supplied to one of said decoding transistors connected between said output node and said second transistor.

8. A dynamic type decoder circuit according to claim 2, wherein said first transistor and said second transistor are an N-channel type transistor and a P-channel type transistor, respectively, and said means for forcibly turning transistors on comprises a plurality of inverters each receiving one of the address signals and a plurality of NOR gates each receiving a clock signal supplied to said first transistor and the output signal from one of said inverters, each output signal of said NOR gates being supplied to one of said decoding transistors connected between said output node and said second transistor.

9. A dynamic type decoder circuit according to claim 3, wherein said first transistor and said second transistor are a P-channel type transistor and an N-channel type transistor, respectively, and said means for forcibly turning transistors on comprises one or more inverters each receiving one of the address signals and one or more NAND gates each receiving a clock signal supplied to said first transistor and the output signal from one of said inverters, each output signal of said NAND gates being supplied to one of said decoding transistors and said other decoding transistors each connected between said output node and one of said decoding transistor and said other decoding transistor directly connected to said second transistor.

10. A dynamic type decoder circuit according to claim 3, wherein said first transistor and said second transistor are an N-channel type transistor and a P-channel type transistor, respectively, and said means for forcibly turning transistors on comprises one or more inverters each receiving one of the address signals and one or more NOR gates each receiving a clock signal supplied to said first transistor and the output signal from one of said inverters, each output signal of said NOR gates being supplied to one of said decoding transistors and said other decoding transistors each connected between said output node and one of said decoding transistor and said other decoding transistor directly connected to said second transistor.

11. A dynamic type decoder circuit according to claim 4, wherein said first transistor and said second transistor are a P-channel type transistor and an N-channel type transistor, respectively, and said means for forcibly turning transistors on comprises a plurality of inverters each receiving one of the address signals and a plurality of NAND gates each receiving a clock signal supplied to said first transistor and the output signal from one of said inverters, each output signal of said NAND gates being supplied to one of said decoding transistors and said other decoding transistors each connected between said output node and said second transistor.

12. A dynamic type decoder circuit according to claim 4, wherein said first transistor and said second transistor are an N-channel type transistor and a P-channel type transistor, respectively, and said means for forcibly turning transistors on comprises a plurality of inverters each receiving one of the address signals and a plurality of NOR gates each receiving a clock signal supplied to said first transistor and the output signal from one of said inverters, each output signal of said NOR gates being supplied to one of said decoding transistors and said other decoding transistors each connected between said output node and said second transistor.

* * * * *